US008853775B2

(12) United States Patent  
Ogura et al.

(10) Patent No.: US 8,853,775 B2  
(45) Date of Patent: Oct. 7, 2014

(54) INSULATED GATE BIPOLAR TRANSISTOR HAVING CONTROL ELECTRODE DISPOSED IN TRENCH

(71) Applicant: Kabushiki Kaisha Toshiba, Minato-ku (JP)

(72) Inventors: Tsuneo Ogura, Kamakura (JP); Kazutoshi Nakamura, Himeji (JP); Hideaki Ninomiya, Himeji (JP); Tomoko Matsudai, Tokyo (JP); Yuichi Oshino, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/021,586

(22) Filed: Sep. 9, 2013

(65) Prior Publication Data

US 2014/0077258 A1 Mar. 20, 2014

(30) Foreign Application Priority Data

Sep. 19, 2012 (JP) .................................. 2012-205741

(51) Int. Cl.
*H01L 29/66* (2006.01)
*H01L 29/739* (2006.01)
*H01L 29/423* (2006.01)
*H01L 29/06* (2006.01)
*H01L 29/10* (2006.01)

(52) U.S. Cl.
CPC ........ *H01L 29/7395* (2013.01); *H01L 29/7397* (2013.01); *H01L 29/4236* (2013.01); *H01L 29/0696* (2013.01); *H01L 29/1095* (2013.01)
USPC ........... 257/330; 257/331; 257/332; 257/335; 257/341; 257/378

(58) Field of Classification Search
USPC .................. 257/330, 331, 332, 335, 341, 378
See application file for complete search history.

(56) References Cited

U.S. PATENT DOCUMENTS

| | | | |
|---|---|---|---|
| 5,864,159 A | 1/1999 | Takahashi | |
| 6,495,871 B2 | 12/2002 | Hattori et al. | |
| 6,566,691 B1 | 5/2003 | Inoue et al. | |
| 6,670,658 B2 | 12/2003 | Hattori et al. | |
| 6,747,295 B2 | 6/2004 | Inoue et al. | |
| 6,891,224 B2 | 5/2005 | Ogura et al. | |

(Continued)

FOREIGN PATENT DOCUMENTS

| | | |
|---|---|---|
| JP | 2008-034467 A | 2/2008 |
| JP | 2010-272741 A | 12/2010 |

(Continued)

*Primary Examiner* — Ngan Ngo  
(74) *Attorney, Agent, or Firm* — White & Case LLP

(57) ABSTRACT

In one embodiment, a semiconductor device includes a semiconductor substrate having first and second main surfaces, control electrodes disposed in trenches on the first main surface of the semiconductor substrate and extending in a first direction parallel to the first main surface, and control interconnects disposed on the first main surface of the semiconductor substrate and extending in a second direction perpendicular to the first direction. The semiconductor substrate includes a first semiconductor layer of a first conductivity type, second semiconductor layers of a second conductivity type on a surface of the first semiconductor layer on a first main surface side, third semiconductor layers of the first conductivity type disposed on surfaces of the second semiconductor layers on the first main surface side and extending in the second direction, and a fourth semiconductor layer of the second conductivity type on the second main surface of the semiconductor substrate.

20 Claims, 11 Drawing Sheets

(56) References Cited

U.S. PATENT DOCUMENTS

| | | |
|---|---|---|
| 6,894,347 B2 | 5/2005 | Hattori et al. |
| 6,921,687 B2 | 7/2005 | Hattori et al. |
| 7,115,939 B2 * | 10/2006 | Forbes .................. 257/314 |
| 7,268,390 B2 | 9/2007 | Ogura et al. |
| 7,800,168 B2 | 9/2010 | Ogura et al. |
| 2001/0026977 A1 | 10/2001 | Hattori et al. |
| 2003/0038318 A1 * | 2/2003 | Forbes .................. 257/331 |
| 2003/0089966 A1 | 5/2003 | Hattori et al. |
| 2004/0089886 A1 | 5/2004 | Hattori et al. |
| 2005/0062064 A1 | 3/2005 | Hattori et al. |
| 2012/0074459 A1 | 3/2012 | Ogura |
| 2013/0181282 A1 * | 7/2013 | Yilmaz et al. .................. 257/330 |
| 2013/0221402 A1 | 8/2013 | Ogura et al. |

FOREIGN PATENT DOCUMENTS

| | | |
|---|---|---|
| JP | 2011-009539 A | 1/2011 |
| JP | 2011-054881 A | 3/2011 |
| JP | 2012-03888 A | 2/2012 |
| JP | 2012-038888 A | 2/2012 |
| JP | 2012-039133 A | 2/2012 |

* cited by examiner

INSULATED GATE BIPOLAR TRANSISTOR HAVING CONTROL ELECTRODE DISPOSED IN TRENCH

CROSS REFERENCE TO RELATED APPLICATION

This application is based upon and claims the benefit of priority from the prior Japanese Patent Application No. 2012-205741, filed on Sep. 19, 2012, the entire contents of which are incorporated herein by reference.

FIELD

Embodiments described herein relate to a semiconductor device.

BACKGROUND

In recent years, research and development have been actively carried out with respect to a semiconductor device including a power transistor such as an insulated gate bipolar transistor (IGBT). However, progress of size shrink of the power transistor causes problems that it becomes difficult to reduce on-resistance and gate resistance of the power transistor and to increase operation speed of the power transistor, so that it is not possible to improve performance of the power transistor.

DETAILED DESCRIPTION

Embodiments will now be explained with reference to the accompanying drawings.

In one embodiment, a semiconductor device includes a semiconductor substrate having first and second main surfaces. The device further includes control electrodes disposed in trenches on the first main surface of the semiconductor substrate via insulators, and extending in a first direction parallel to the first main surface. The device further includes control interconnects disposed on the first main surface of the semiconductor substrate so as to be electrically connected to the control electrodes, and extending in a second direction perpendicular to the first direction. The semiconductor substrate includes a first semiconductor layer of a first conductivity type disposed in the semiconductor substrate, and one or more second semiconductor layers of a second conductivity type disposed on a surface of the first semiconductor layer on a first main surface side so as to be sandwiched between the control electrodes. The semiconductor substrate further includes one or more third semiconductor layers of the first conductivity type disposed on surfaces of the second semiconductor layers on the first main surface side so as to be sandwiched between the control electrodes, and extending in the second direction, and a fourth semiconductor layer of the second conductivity type disposed on the second main surface of the semiconductor substrate.

(First Embodiment)

Figure 1A:
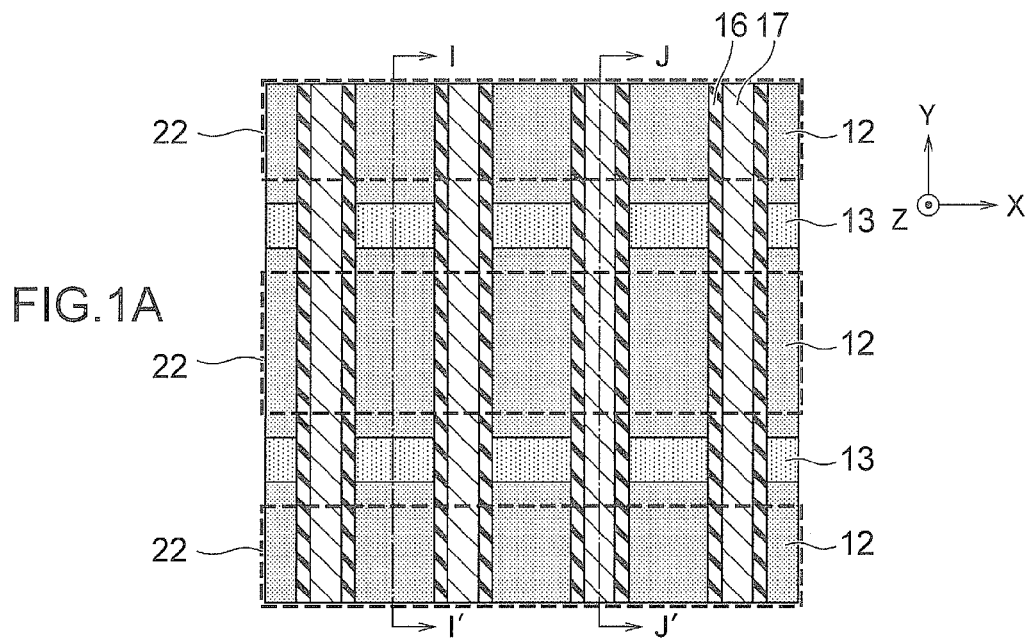
FIGS. 1A to 1C are a plan view and sectional views showing a structure of a semiconductor device of a first embodiment.
Figure 1B:
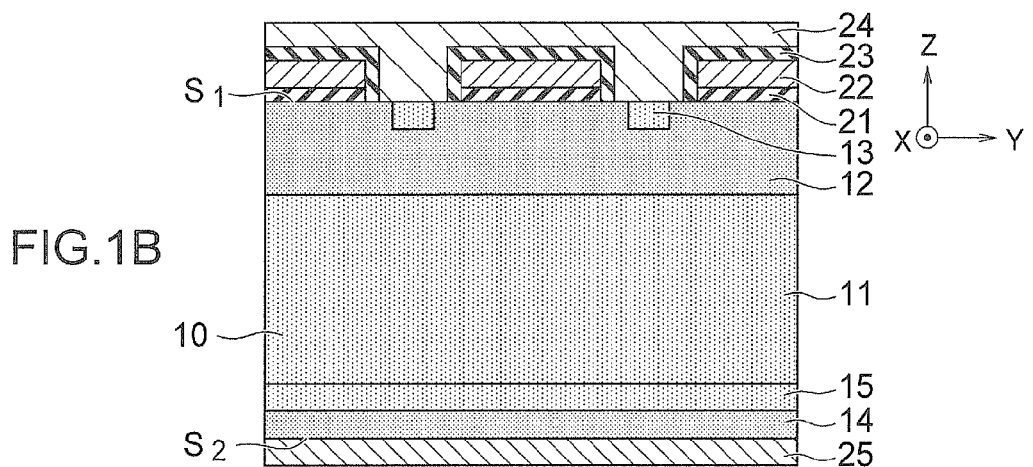
Figure 1C:
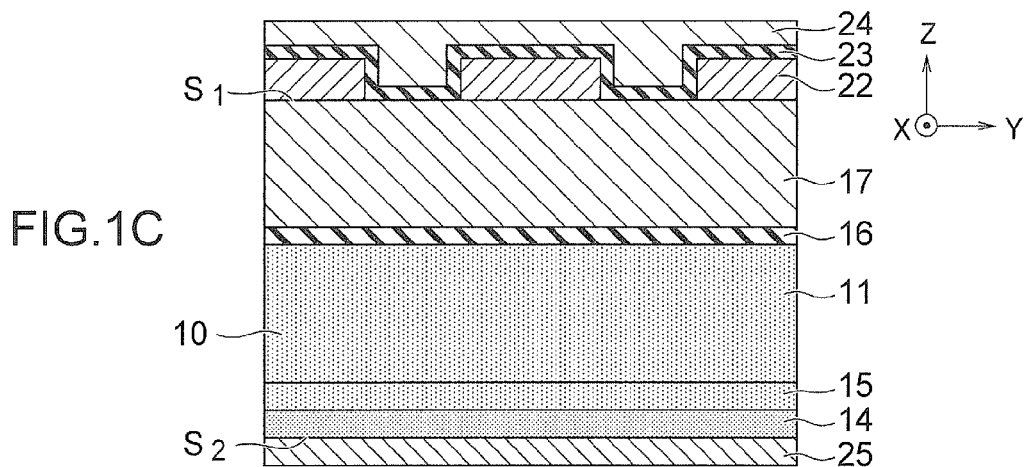

FIGS. 1A to 1C are a plan view and sectional views showing a structure of a semiconductor device of a first embodiment. FIG. 1A is the plan view showing the structure of the semiconductor device, and FIGS. 1B and 1C are the sectional views taken along a line I-I' and a line J-J' in FIG. 1A, respectively.

As components of a power transistor (specifically, IGBT), a semiconductor substrate 10 of the semiconductor device in FIGS. 1A to 1C includes an n--type first base layer 11 as an example of a first semiconductor layer, p-type second base layers 12 as an example of one or more second semiconductor layers, n+-type emitter layers (source layers) 13 as an example of one or more third semiconductor layers, a p-type collector layer (drain layer) 14 as an example of a fourth semiconductor layer, and an n-type buffer layer 15.

As the components of the power transistor, the semiconductor device in FIGS. 1A to 1C further includes gate insulators 16, gate electrodes 17 as an example of control electrodes, insulators 21, gate interconnects 22 as an example of control interconnects, an insulator 23, an emitter electrode 24, and a collector electrode 25.

In the present embodiment, first and second conductivity types are an n-type and a p-type, respectively. However, the first and second conductivity types may be the p-type and the n-type, respectively.

The semiconductor substrate 10 is, for example, a silicon substrate. Symbols $S_1$ and $S_2$ respectively indicate a first main surface (front surface) and a second main surface (back surface) of the semiconductor substrate 10. FIGS. 1A to 1C illustrate X and Y directions which are parallel to the main surfaces of the semiconductor substrate 10 and perpendicular to each other, and a Z direction which is perpendicular to the main surfaces of the semiconductor substrate 10. The Y and X directions are examples of first and second directions, respectively.

The gate insulators 16 are formed on side and bottom surfaces of trenches formed on the first main surface $S_1$ of the semiconductor substrate 10 so as to extend in the Y direction. The gate insulators 16 are, for example, silicon oxide layers. The gate electrodes 17 are formed in these trenches via the gate insulators 16 and extend in the Y direction. The gate electrodes 17 are, for example, polysilicon layers.

The first base layer 11 is a high-resistivity layer in the semiconductor substrate 10. The second base layers 12 are formed on a surface of the first base layer 11 on the first main surface $S_1$ side so as to be sandwiched between the gate electrodes 17, and extend in the Y direction. The emitter layers 13 are formed on surfaces of the second base layers 12 on the first main surface $S_1$ side so as to be sandwiched between the gate electrodes 17, and extend in the X direction. The collector layer 14 is formed on the second main surface $S_2$ of the semiconductor substrate 10. The buffer layer 15 is formed between the first base layer 11 and the collector layer 14.

The gate interconnects 22 are formed on the first main surface $S_1$ of the semiconductor substrate 10 via the insulators 21 so as to be electrically connected to the gate electrodes 17, and extend in the X direction. The insulators 21 are, for example, silicon oxide layers. The gate interconnects 22 are, for example, polysilicon layers. The Y directional width of the gate interconnects 22 is set to, for example, 50 μm or less.

The emitter electrode 24 is formed on the first main surface $S_1$ of the semiconductor substrate 10 via the insulators 21, the gate interconnects 22, and the insulator 23, and is electrically connected to the emitter layers 13 and the second base layers 12. The collector electrode 25 is formed on the second main surface $S_2$ of the semiconductor substrate 10, and is electrically connected to the collector layer 14.

As described above, the gate interconnects 22 in the present embodiment do not extend in the Y direction as same as the gate electrodes 17, but extends in the X direction which is orthogonal to the gate electrodes 17. According to this structure, it is easy to enlarge the size of the gate interconnects 22, independently of the width and length of the gate electrodes 17. Consequently, it is easy to reduce resistance of the gate electrodes 17 and to improve performance of the power transistor, such as uniform operation at on-state, turn-on transient and turn-off transient.

The emitter layers 13 in the present embodiment also extend in the X direction. Compared to a case where the emitter layers 13 extend in the Y direction, such structure has an advantage that it is easy to dispose such gate interconnects 22 that extend in the X direction. As illustrated in FIG. 1A, the emitter layers 13 and the gate interconnects 22 in the present embodiment are alternately disposed along the Y direction.

In the present embodiment, the number of the gate interconnects 22 disposed on the semiconductor substrate 10 may be decreased or increased. However, it is necessary in the latter case to reduce the Y directional width of the gate interconnects 22. Accordingly, in order to realize the latter structure, it is desirable to set the Y directional width of the gate interconnects 22 to 20 μm or less in the present embodiment.

The present embodiment is applicable not only to the power transistor of the silicon type but also to a power transistor of a compound material type. Examples of a compound material layer forming the latter power transistor include an SiC layer and a GaN layer.

Figure 2:
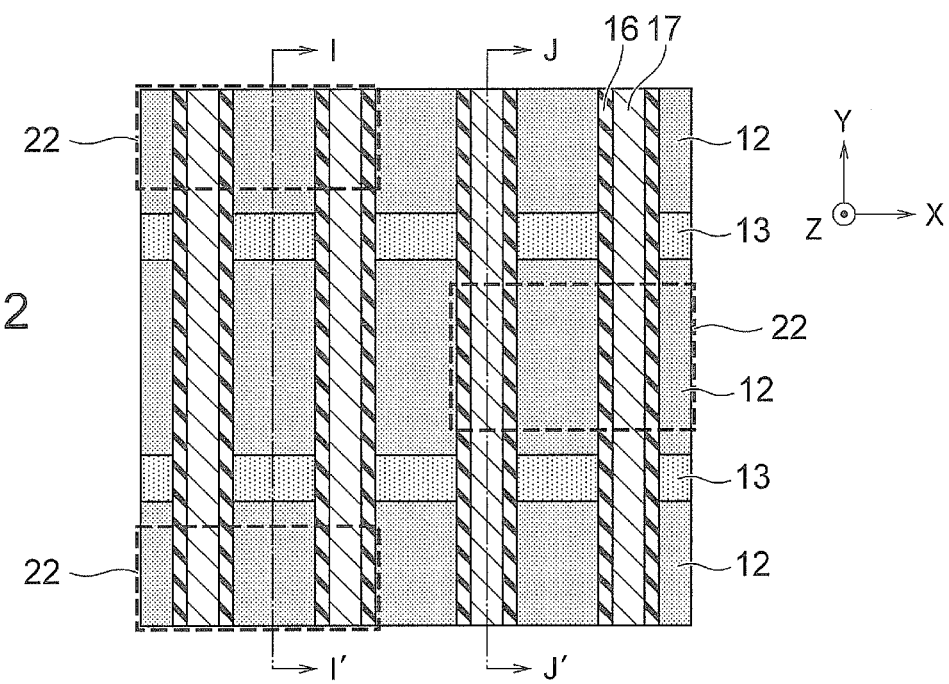
FIG. 2 is a plan view showing a structure of a semiconductor device of a modification of the first embodiment.
Figure 3:
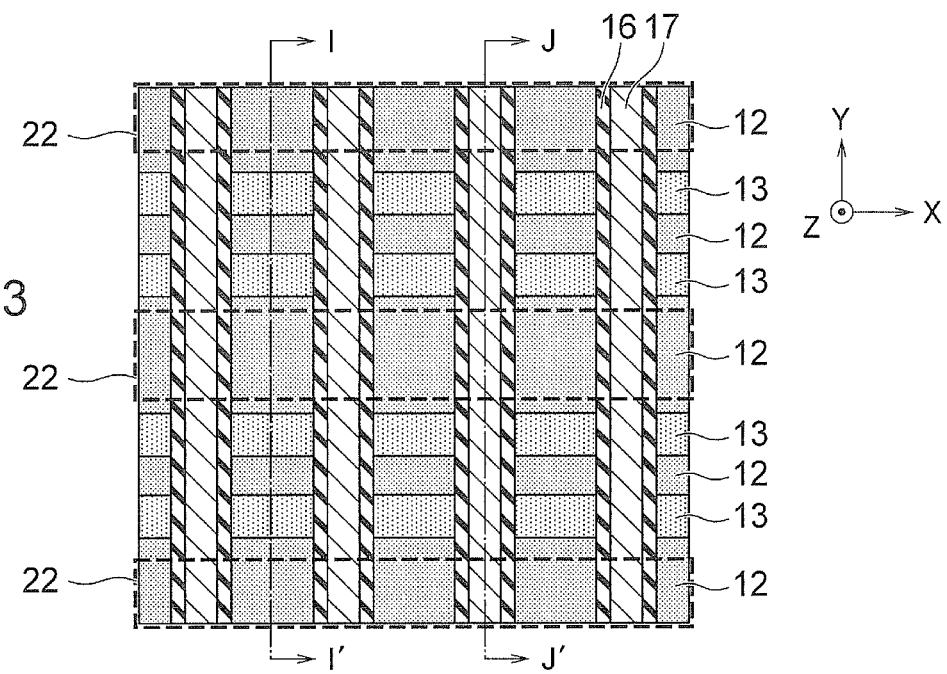
FIG. 3 is a plan view showing a structure of a semiconductor device of another modification of the first embodiment.

For example, the present embodiment may employ a structure illustrated in FIG. 2 or 3 in place of the structure illustrated in FIGS. 1A to 1C. FIGS. 2 and 3 are plan views showing structures of semiconductor devices of modifications of the first embodiment. In FIGS. 1A to 1C, each gate interconnect 22 is disposed on all of the gate electrodes 17, whereas each gate interconnect 22 in FIG. 2 is disposed only on a part of the gate electrodes 17. On the line I-I' in FIGS. 1A to 1C, only one emitter layer 13 is disposed between gate interconnects 22 adjacent to each other, whereas on the line I-I' in FIG. 3, a plurality of (herein, two) emitter layers 13 are disposed between gate interconnects 22 adjacent to each other. These structures in FIGS. 2 and 3 may be employed in the present embodiment.

(Second Embodiment)

Figure 4A:
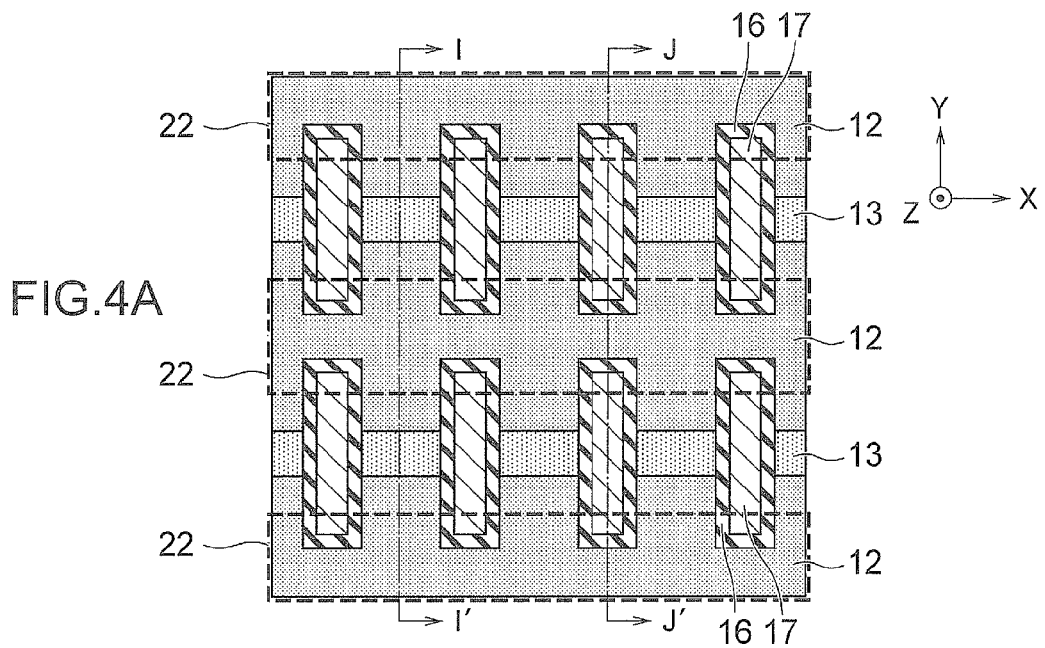
FIGS. 4A to 4C are a plan view and sectional views showing a structure of a semiconductor device of a second embodiment.
Figure 4B:
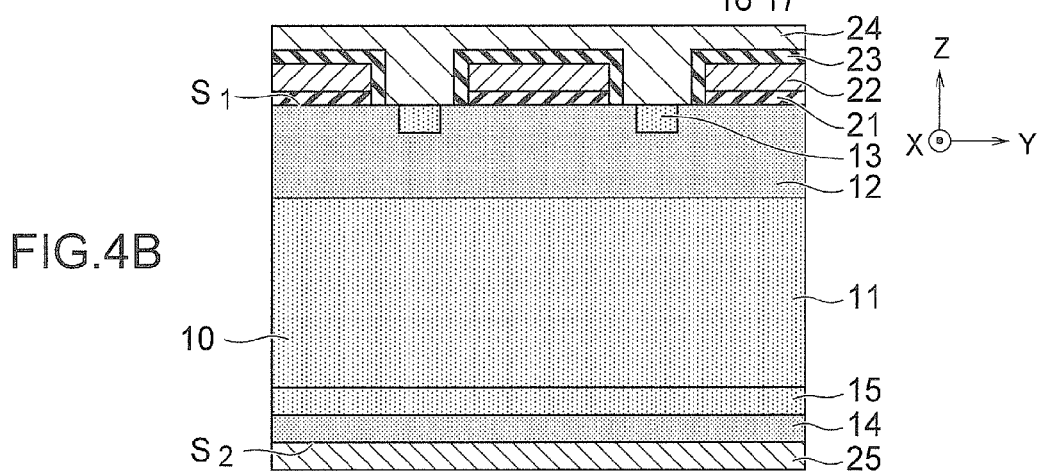
Figure 4C:
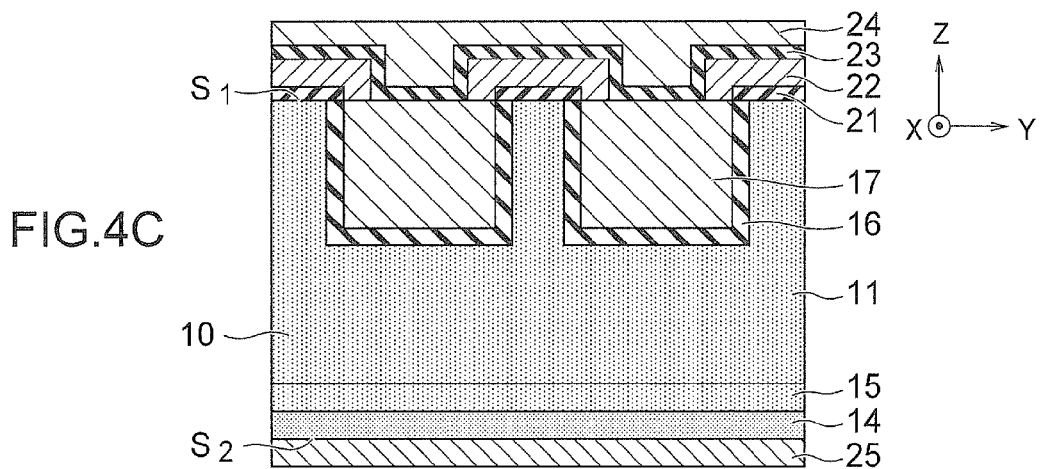

FIGS. 4A to 4C are a plan view and sectional views showing a structure of a semiconductor device of a second embodiment.

As similarly to the first embodiment, the gate electrodes 17 in the present embodiment are disposed on a plurality of straight lines parallel to the Y direction. The line J-J' corresponds to one of these straight lines. However, only one gate electrode 17 is disposed on each of the straight lines in the first embodiment, whereas two or more gate electrodes 17 which are separated from each other are disposed on each of the straight lines in the second embodiment. In other words, the gate electrodes 17 of the present embodiment have such shapes that are obtained by dividing each gate electrode 17 of the first embodiment in the Y direction.

According to the present embodiment, capacitance between the semiconductor substrate 10 and the gate electrodes 17 is reduced and the operation speed of the power transistor can be increased by dividing the gate electrodes 17 in this way. Therefore, according to the present embodiment, both of the reduction in the resistance of the gate electrodes 17 and the high performance of the power transistor can be easily achieved.

Each gate interconnect 22 in the present embodiment is disposed to be sandwiched between gate electrodes 17 adjacent to each other in the Y direction, and is electrically connected to both of these gate electrodes 17. Such structure has an advantage that, for example, connecting portions of the gate electrodes 17 and the gate interconnects 22 and connecting portions of the emitter layers 13 and the emitter electrode 24 are easily laid out.

In the present embodiment, only one emitter layer 13 is disposed between two gate electrodes 17 adjacent in the X direction. However, two or more emitter layers 13 may be disposed between them.

(Third Embodiment)

Figure 5A:
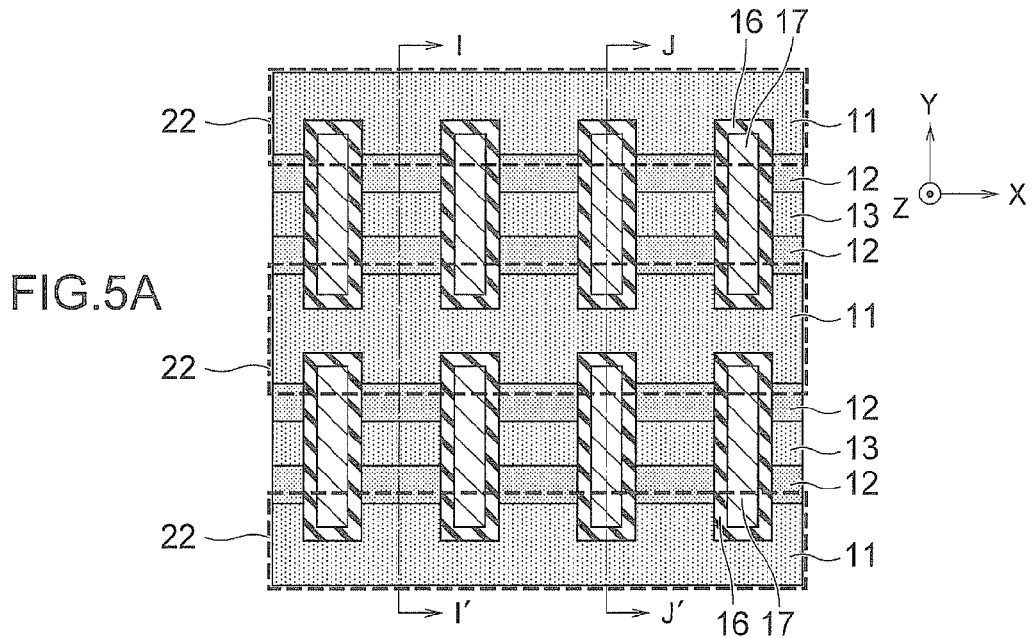
FIGS. 5A to 5C are a plan view and sectional views showing a structure of a semiconductor device of a third embodiment.
Figure 5B:
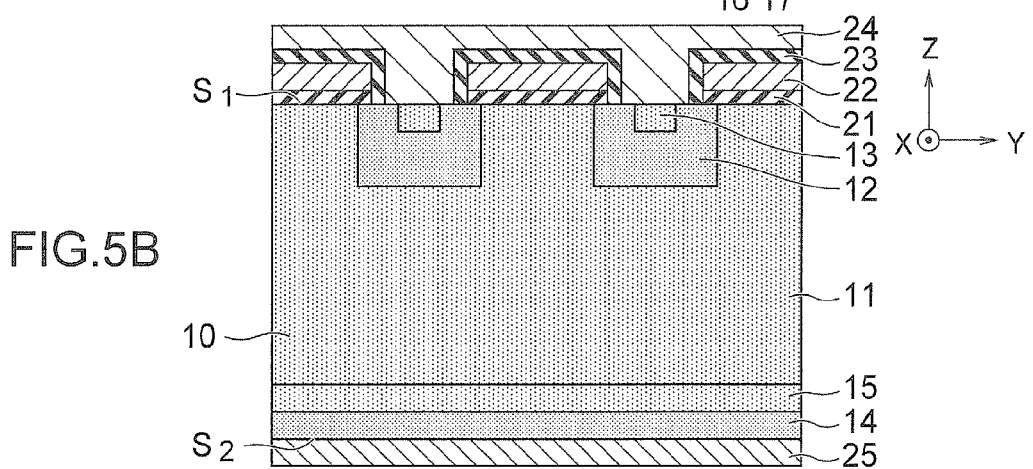
Figure 5C:
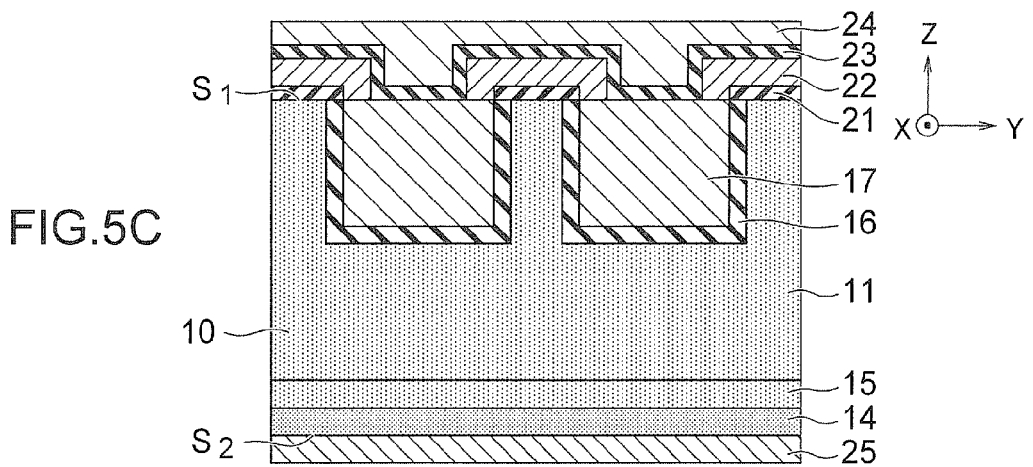

FIGS. 5A to 5C are a plan view and sectional views showing a structure of a semiconductor device of a third embodiment.

As similarly to the first embodiment, the second base layers 12 in the present embodiment are disposed on a plurality of straight lines parallel to the Y direction. The line corresponds to one of these straight lines. However, only one second base layer 12 is disposed on each of the straight lines in the first embodiment, whereas two or more second base layers 12 which are separated from each other are disposed on each of the straight lines in the third embodiment. In other words, the second base layers 12 of the present embodiment have such shapes that are obtained by dividing each second base layer 12 of the first embodiment in the Y direction. In addition, as similarly to the gate electrodes 17 of the second embodiment, the gate electrodes 17 of the present embodiment have such shapes that are obtained by dividing each gate electrode 17 of the first embodiment in the Y direction.

According to the present embodiment, it is possible to increase a carrier injection enhancing effect (IE effect) and to decrease the on-resistance of the power transistor by dividing the second base layers 12 in this way. Therefore, according to the present embodiment, both of the reduction in the resistance of the gate electrodes 17 and the high performance of the power transistor can be easily achieved.

In the present embodiment, only one second base layer 12 is disposed between two gate electrodes 17 adjacent in an X direction. However, two or more second base layers 12 may be disposed between them.

In the present embodiment, only one emitter layer 13 is disposed in one second base layer 12. However, two or more emitter layers 13 may be disposed in one second base layer 12.

Each gate interconnect 22 in the present embodiment is disposed to be sandwiched between gate electrodes 17 adjacent to each other in the Y direction, and is electrically connected to both of these gate electrodes 17. Additionally, each gate interconnect 22 in the present embodiment is disposed to be sandwiched between second base layers 12 adjacent to each other in the Y direction, and is disposed on both of these second base layers 12. Such structure has an advantage that, for example, connecting portions of the gate electrodes 17 and the gate interconnects 22 and connecting portions of the emitter layers 13 and the emitter electrode 24 are easily laid out.

(Fourth Embodiment)

Figure 6A:
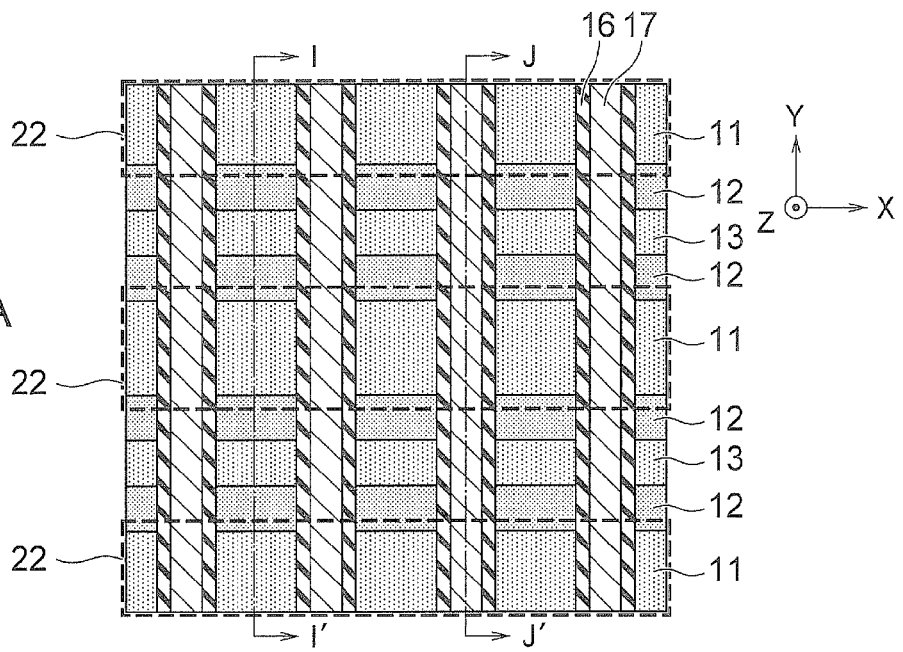
FIGS. 6A to 6C are a plan view and sectional views showing a structure of a semiconductor device of a fourth embodiment.
Figure 6B:
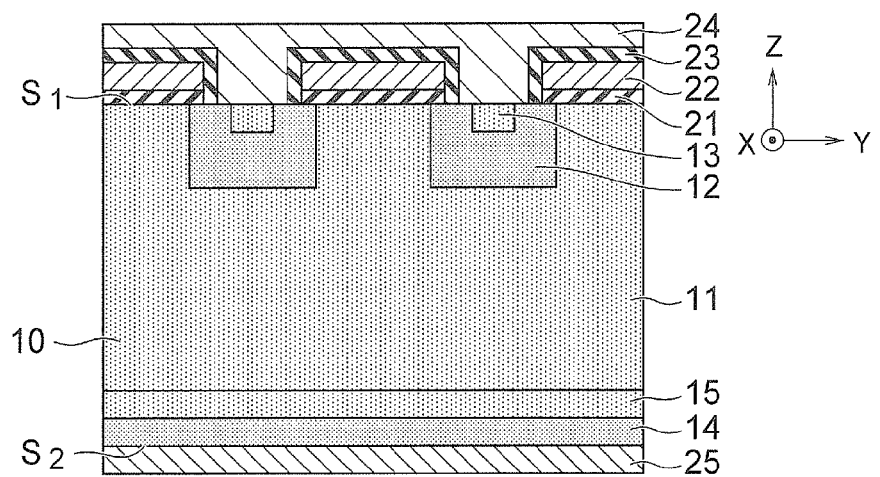
Figure 6C:
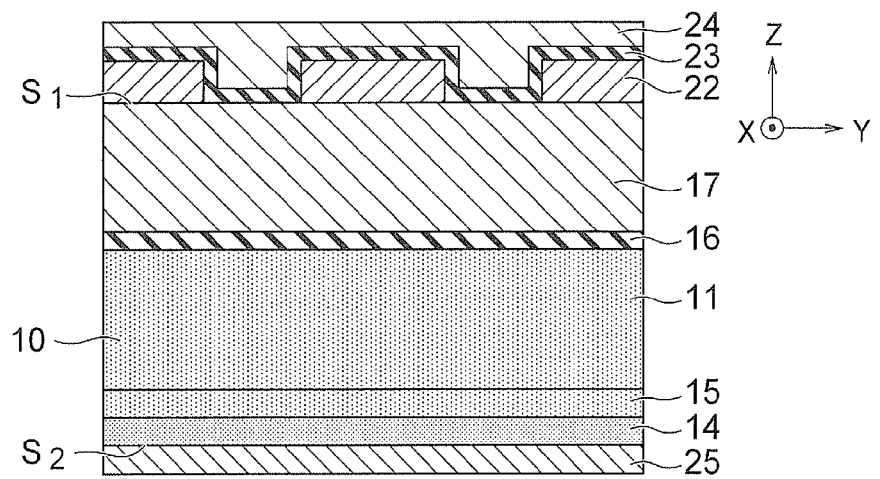

FIGS. 6A to 6C are a plan view and sectional views showing a structure of a semiconductor device of a fourth embodiment.

As similarly to the second base layers 12 of the third embodiment, the second base layer 12 of the present embodiment have such shapes that are obtained by dividing each second base layer 12 of the first embodiment in the Y direction. However, unlike the gate electrodes 17 of the third embodiment, the gate electrodes 17 of the present embodiment are not divided in the Y direction.

According to the present embodiment, it is possible to increase the IE effect and to decrease the on-resistance of the power transistor by dividing the second base layers 12 in the Y direction, as similarly to the third embodiment. Therefore, according to the present embodiment, both of the reduction in the resistance of the gate electrodes 17 and the high performance of the power transistor can be more easily achieved than the first embodiment.

(Fifth Embodiment)

Figure 7A:
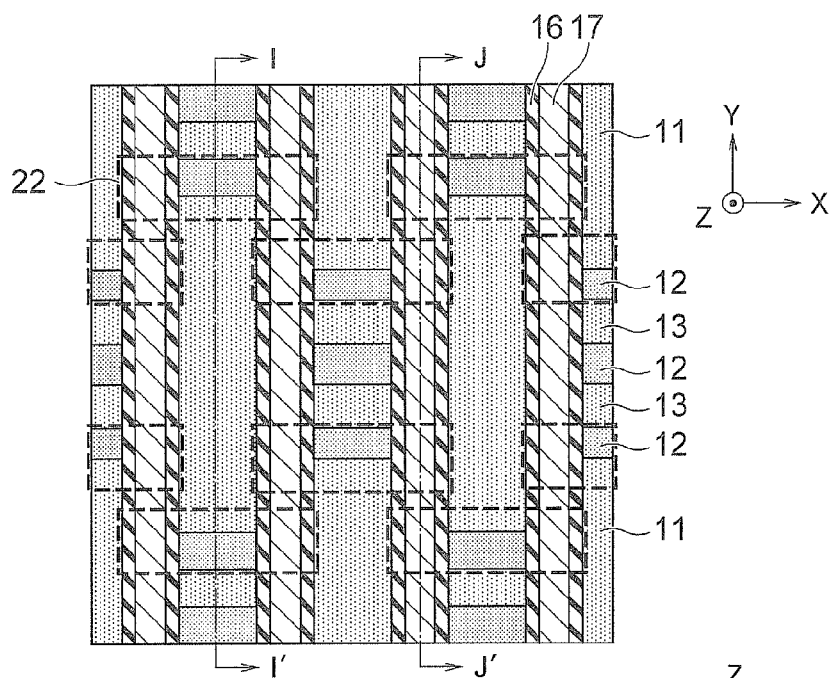
FIGS. 7A to 7C are a plan view and sectional views showing a structure of a semiconductor device of a fifth embodiment.
Figure 7B:
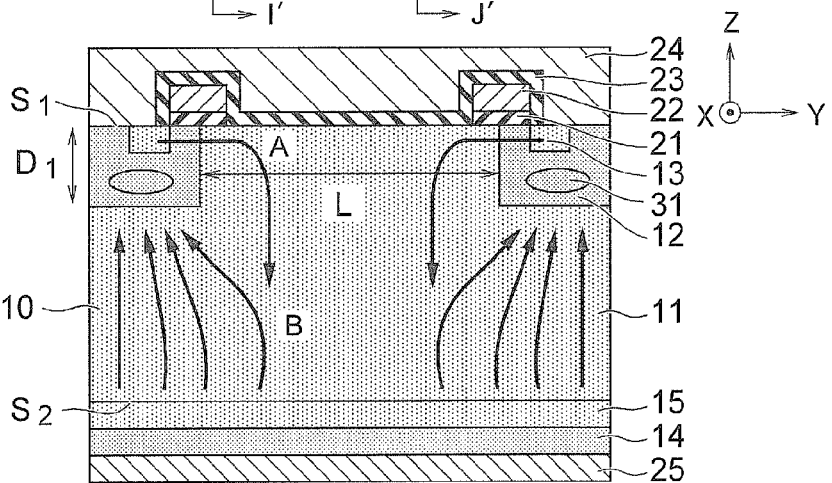
Figure 7C:
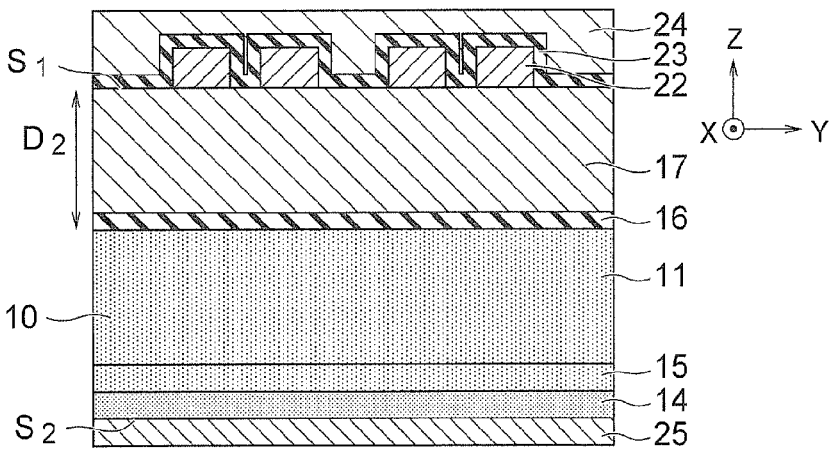

FIGS. 7A to 7C are a plan view and sectional views showing a structure of a semiconductor device of a fifth embodiment.

As similarly to the second base layers 12 of the fourth embodiment, the second base layers 12 of the present embodiment have such shapes that are obtained by dividing each second base layers 12 of the first embodiment in the Y direction. Furthermore, as similarly to the gate electrodes 17 of the fourth embodiment, the gate electrodes 17 of the present embodiment are not divided in the Y direction. However, unlike the second base layers 12 of the fourth embodiment, the second base layers 12 of the present embodiment are disposed in a staggered arrangement as illustrated in FIG. 7A.

Moreover, as illustrated in FIG. 7B, each gate interconnect 22 of the present embodiment is continuously formed on the surface of the first base layer 11 and the surface of one second base layer 12 via an insulator 21. Consequently, each gate interconnect 22 of the present embodiment functions as a gate electrode of a planar-type MOSFET. Therefore, according to the present embodiment, a current can be flowed laterally in the semiconductor substrate 10 near each gate interconnect 22 as indicated by arrows A.

Furthermore, as illustrated in FIG. 7B, each second base layer 12 of the present embodiment includes a P+-type diffusion layer 31 as an example of one or more fifth semiconductor layers between a bottom surface of the second base layer 12 and a bottom surface of an emitter layer 13. A concentration of p-type impurities in the diffusion layer 31 is set higher than a concentration of p-type impurities in the second base layer 12. According to the present embodiment, activation of a parasitic NPN transistor formed by the first base layer 11, the second base layer 12 and the emitter layer 13 can be suppressed by disposing such diffusion layer 31.

A symbol L illustrated in FIG. 7B indicates a distance between second base layers 12 adjacent in the Y direction. A symbol $D_1$ indicates a vertical length (height) of the second base layers 12, and a symbol $D_2$ indicates a vertical length (height) of the trenches for the gate electrodes 17. In the present embodiment, the vertical length $D_1$ is set smaller than the vertical length $D_2$ ($D_1<D_2$).

Effects of the fifth embodiment are described herein. In a case where the second base layers 12 are divided in the Y direction as in the present embodiment, the on-voltage can be reduced by increasing the distance L. This is because when the distance L is increased, areas of the second base layers 12 are decreased. Consequently, as indicated by arrows 13, holes are not easily escaped and the IE effect is increased. However, the IE effect is limited by reducing the channel density caused by increasing the distance L.

The present embodiment therefore employs the structure in which the gate interconnects 22 function as the gate electrodes of the MOSFETs, so that the current flows laterally and an amount of the current is increased. Accordingly, it is possible in the present embodiment to increase an injection amount of electrons and to reduce the on-voltage without losing the IE effect due to the increase of the distance L. Further, it is possible in the present embodiment to suppress the activation of the parasitic NPN transistor and to reduce the on-voltage more by disposing the diffusion layers 31 as mentioned above.

The second base layers 12 in the present embodiment are disposed in a staggered arrangement. However, the second base layers 12 may be disposed in other arrangements.

(Sixth Embodiment)

Figure 8A:
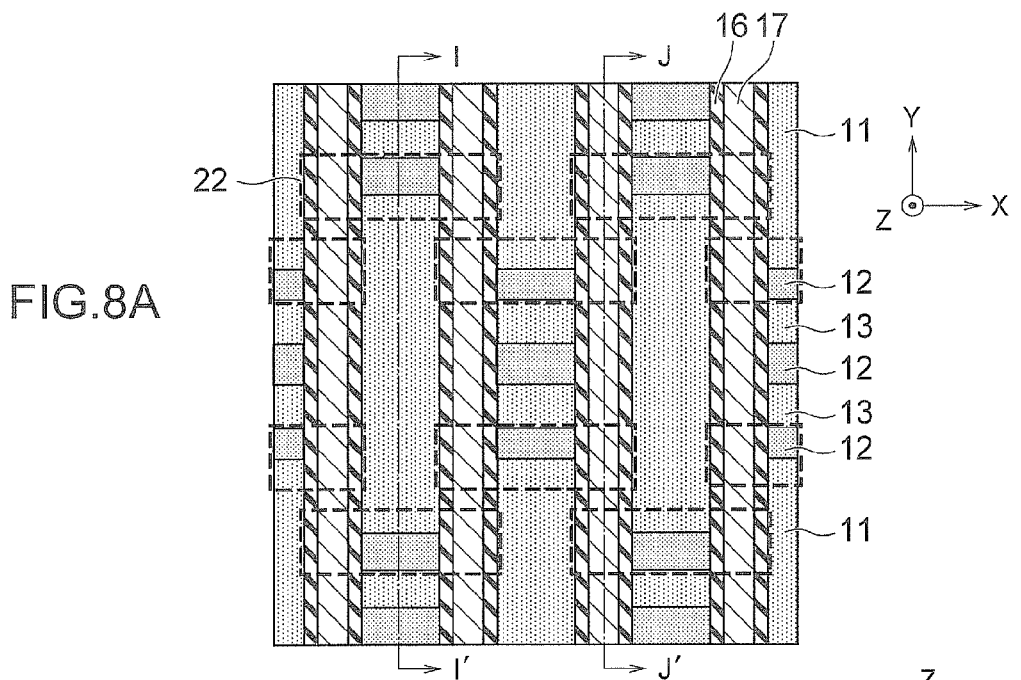
FIGS. 8A to 8C are a plan view and sectional views showing a structure of a semiconductor device of a sixth embodiment.
Figure 8B:
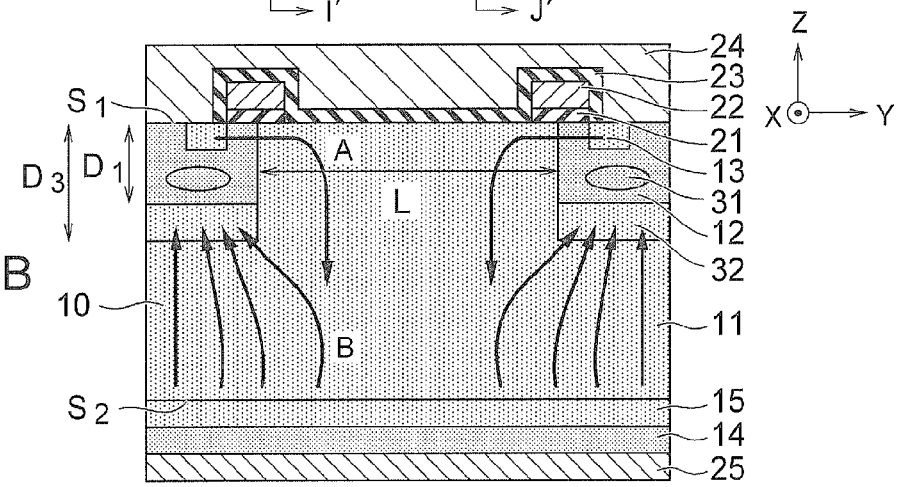
Figure 8C:
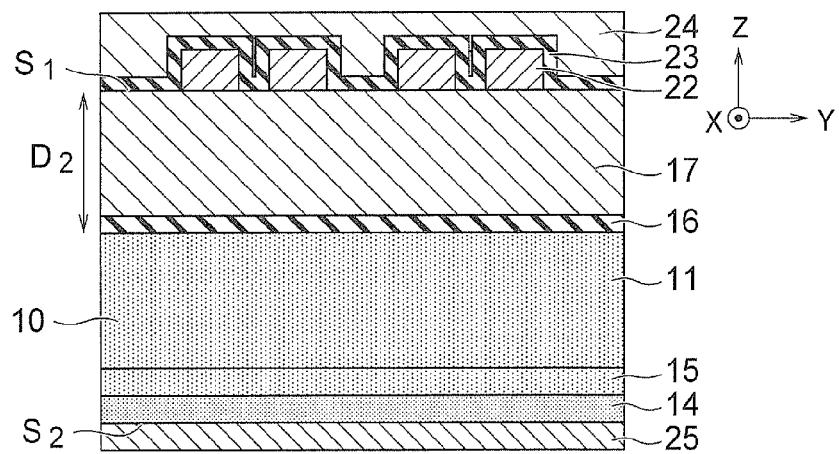

FIGS. 8A to 8C are a plan view and sectional views showing a structure of a semiconductor device of a sixth embodiment.

The semiconductor substrate 10 of the present embodiment includes n-type barrier layers 32 as an example of one or more sixth semiconductor layers. The barrier layers 32 are formed between the first base layer 11 and the second base layers 12 so as to contact the bottom surfaces of the second base layers 12. A concentration of n-type impurities in the barrier layers 32 is set higher than a concentration of n-type impurities in the first base layer 11.

A symbol $D_3$ illustrated in FIG. 8B indicates a sum of vertical lengths of the second base layers 12 and the barrier layers 32. In the present embodiment, the vertical length $D_3$ is set smaller than the vertical length $D_2$ ($D_3<D_2$). This is the same in a seventh embodiment described below.

As described above, the bottom surfaces of the second base layers 12 in the present embodiment are covered with the barrier layers 32. Therefore, according to the present embodiment, a hole current is difficult to flow into the second base layers 12, so that it is possible to increase the IE effect.

In the present embodiment, the bottom surfaces of the second base layers 12 are completely covered with the barrier layers 32. However, the bottom surfaces of the second base layers 12 may be partially covered with the barrier layers 32.

(Seventh Embodiment)

Figure 9A:
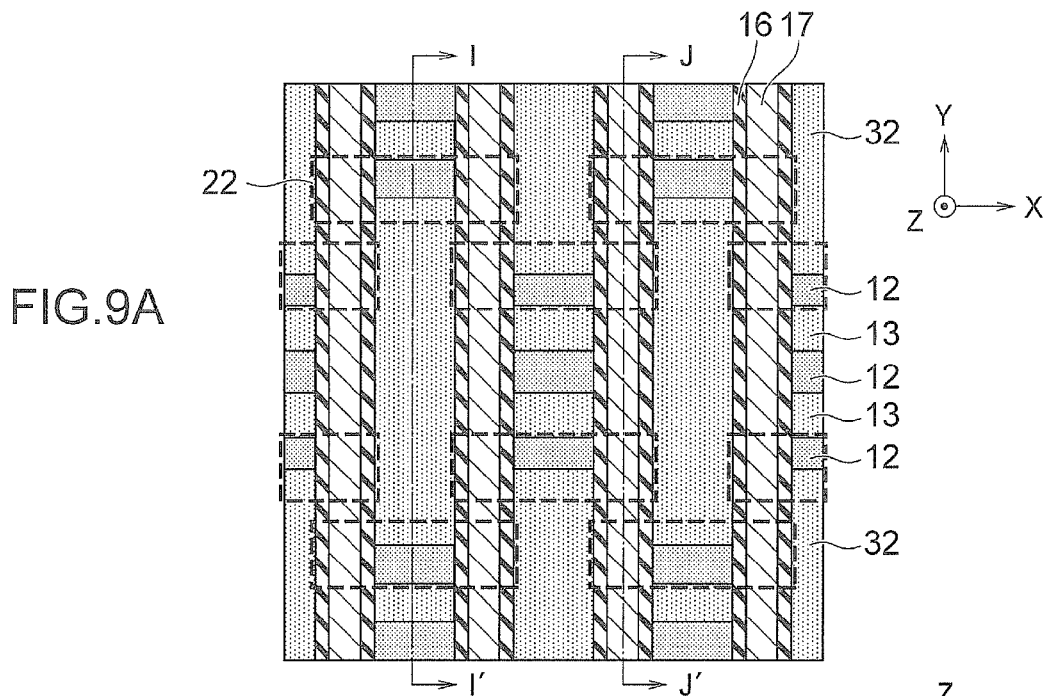
FIGS. 9A to 9C are a plan view and sectional views showing a structure of a semiconductor device of a seventh embodiment.
Figure 9B:
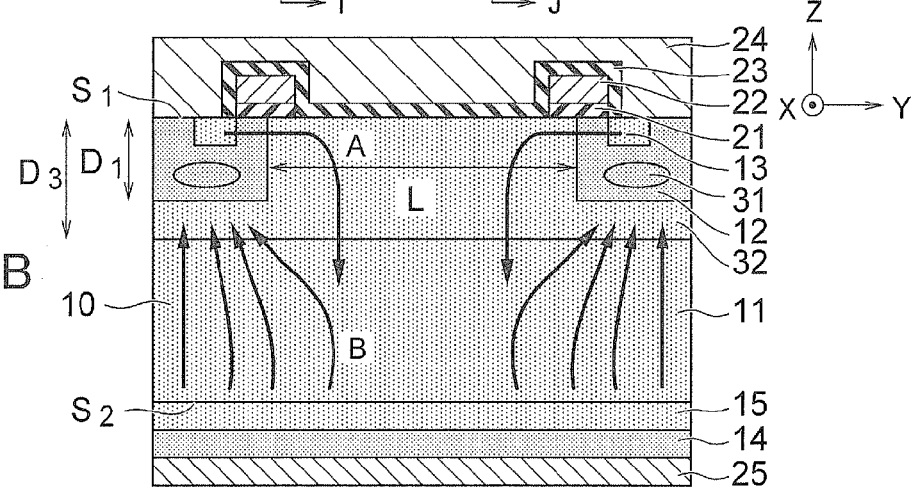
Figure 9C:
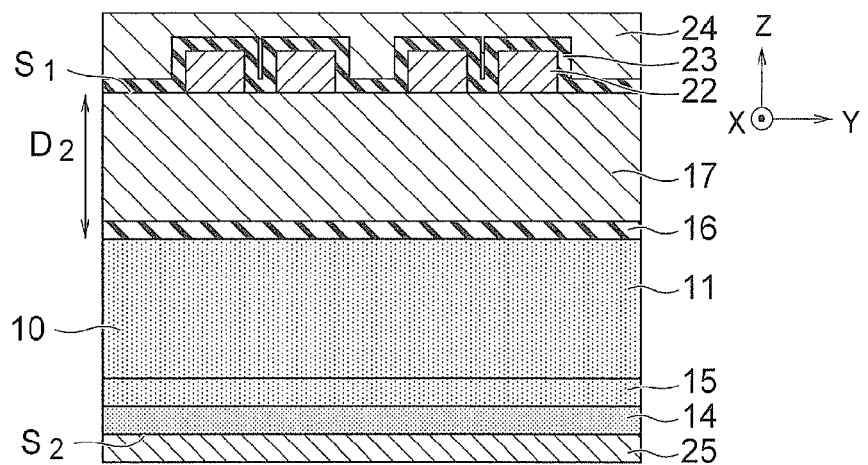

FIGS. 9A to 9C are a plan view and sectional views showing a structure of a semiconductor device of a seventh embodiment.

A barrier layer 32 of the present embodiment is formed between the first base layer 11 and the second base layers 12 so as to contact the bottom surfaces and side surfaces of the second base layers 12. Therefore, according to the present embodiment, the hole current is more difficult to flow into the second base layers 12, so that it is possible to increase the IE effect even further.

In the present embodiment, the bottom and side surfaces of the second base layers 12 are completely covered with the barrier layer 32. However, the bottom and side surfaces of the second base layers 12 may be partially covered with the barrier layer 32.

In the seventh embodiment, one barrier layer 32 contacts the plurality of second base layers 12. However, similarly to the sixth embodiment, one barrier layer 32 may contact one second base layer 12 only. Conversely, in the sixth embodiment, one barrier layer 32 may contact a plurality of second base layers 12 as similarly to the seventh embodiment.

In the present embodiment, even if a distance between the trenches for the gate electrodes 17 is narrowed with increasing the concentration of the n-type impurities in the barrier layer 32, the reduction of the breakdown voltage of the semiconductor device can be prevented by a shielding effect of these trenches.

(Eighth Embodiment)

Figure 10A:
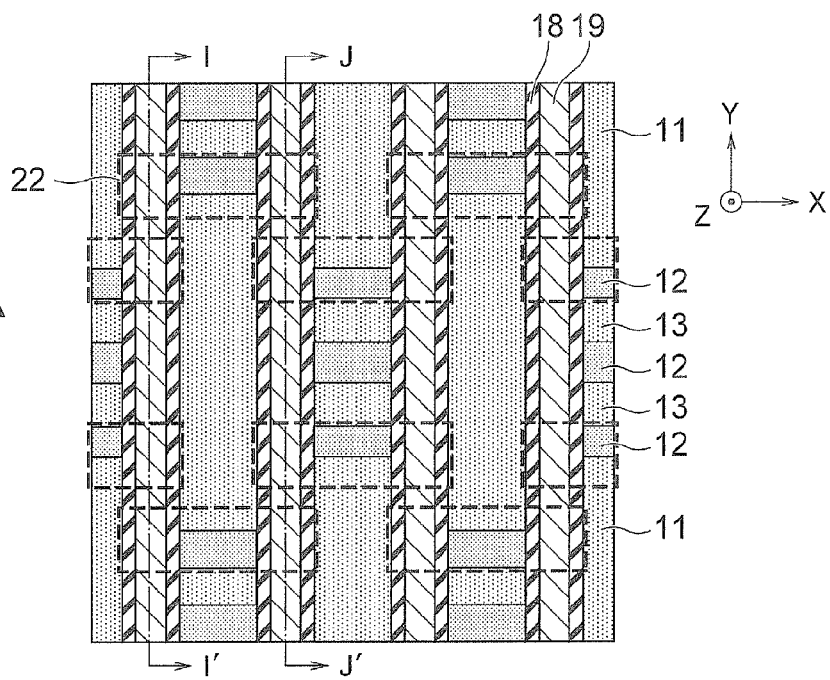
FIGS. 10A to 10C are a plan view and sectional views showing a structure of a semiconductor device of an eighth embodiment.
Figure 10B:
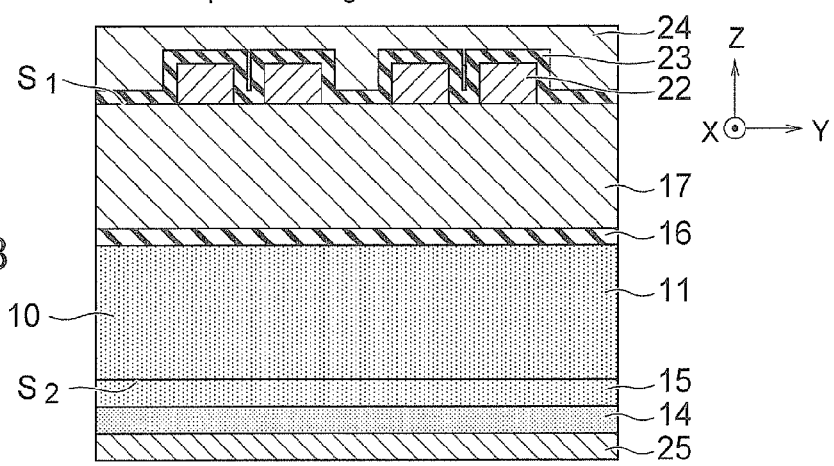
Figure 10C:
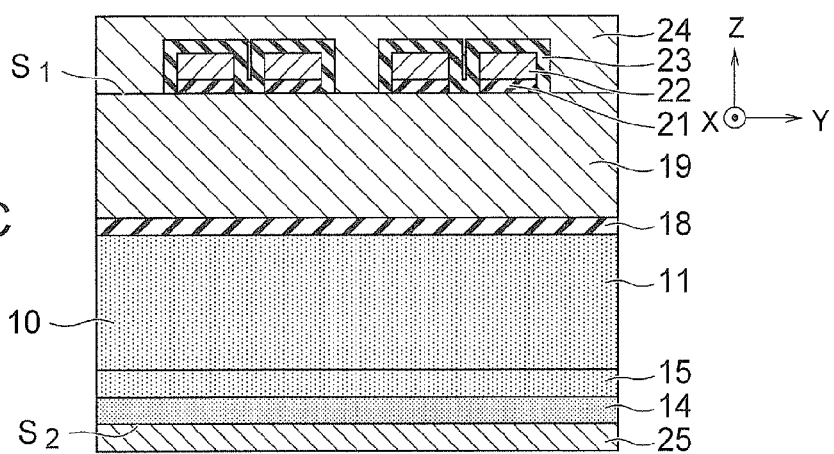

FIGS. 10A to 10C are a plan view and sectional views showing a structure of a semiconductor device of an eighth embodiment. FIG. 10A is the plan view showing the structure of the semiconductor device, and FIGS. 10B and 10C are the sectional views taken along the line I-I' and the line J-J' in FIG. 10A, respectively.

The semiconductor device of the present embodiment includes insulators 18 and emitter electrodes 19 as an example of main electrodes. The insulators 18 are formed on side and bottom surfaces of trenches which are formed between the gate electrodes 17 so as to extend in the Y direction. The emitter electrodes 19 are formed in these trenches via the insulators 18, and extend in the Y direction. The insulators 18 are, for example, silicon oxide layers. The emitter electrodes 19 are, for example, polysilicon layers.

Accordingly, the gate electrodes 17 and the emitter electrodes 19 extending in the Y direction are alternately disposed on the first main surface $S_1$ of the semiconductor substrate 10 in the present embodiment. FIGS. 10B and 10C show sectional views of one gate electrode 17 and one emitter electrode 19, respectively.

As illustrated in FIGS. 10B and 10C, the gate interconnects 22 are electrically connected to the gate electrodes 17, and are electrically insulated from the emitter electrodes 19 by the insulators 21. On the other hand, the emitter electrodes 24 are electrically connected to the emitter electrodes 19, and are electrically insulated from the gate electrodes 17 by the insulator 23.

In the present embodiment, a depth of the trenches for the emitter electrodes 19 is set to the same depth as a depth of the trenches for the gate electrodes 17. However, these depths may be different.

As described above, the gate electrodes 17 and the emitter electrodes 19 are alternately disposed in the trenches formed on the first main surface $S_1$ of the semiconductor substrate 10 so as to extend in the Y direction in the present embodiment. Therefore, according to the present embodiment, it is possible to reduce a gate capacity and to increase controllability of the gates. As a result, according to the present embodiment, the performance of the power transistor can be enhanced while shrinking the power transistor.

(Modifications of First and Second Embodiments)

Figure 11A:
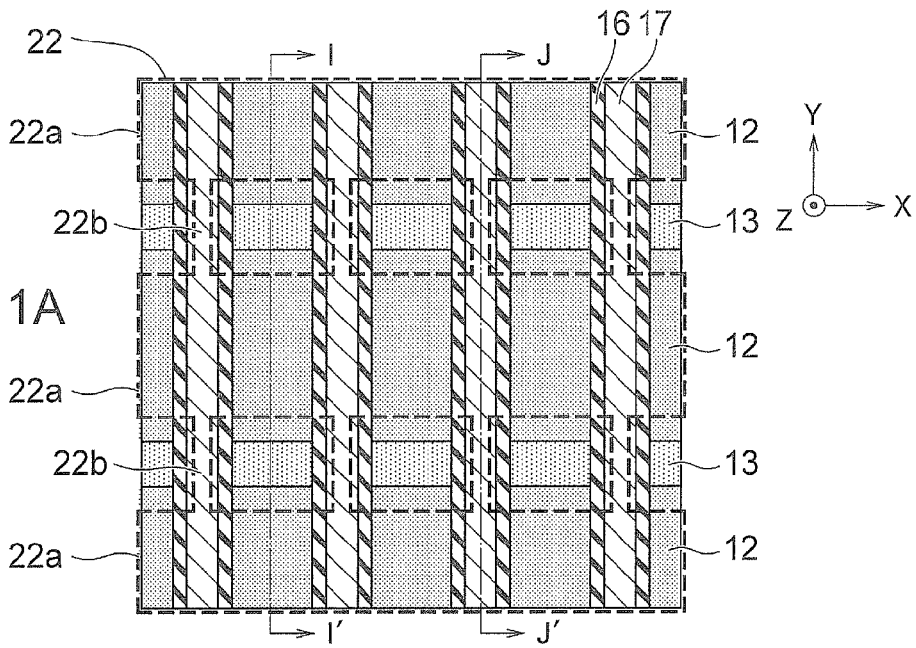
FIGS. 11A to 11C are a plan view and sectional views showing a structure of a semiconductor device of a modification of the first embodiment.
Figure 11B:
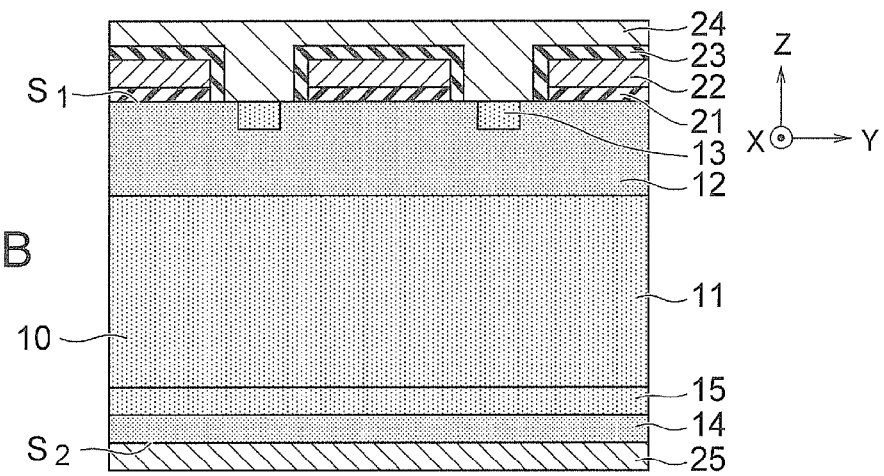
Figure 11C:
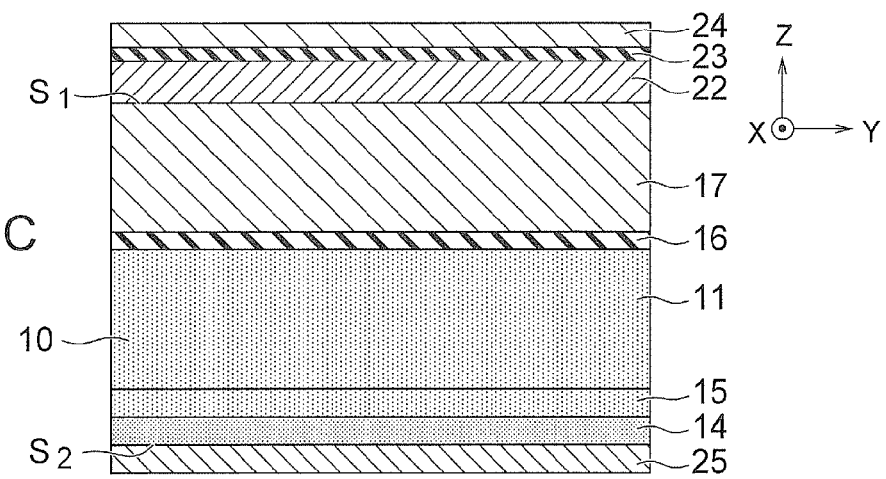

FIGS. 11A to 11C are a plan view and sectional views showing a structure of a semiconductor device of a modification of the first embodiment.

The semiconductor device in FIGS. 11A to 11C includes a gate interconnect 22 formed on the first main surface $S_1$ of the semiconductor substrate 10 via insulators 21, and is electrically connected to the gate electrodes 17. The gate interconnect 22 includes first portions 22a extending in the X direction, and second portions 22b extending in the Y direction, connecting the first portions 22a, and disposed on the gate electrodes 17. As illustrated in FIGS. 11A to 11C, the second portions 22b in the present modification are disposed on all the gate electrodes 17.

The Y directional width of the first portions 22a is set to, for example, 50 μm or less. The X directional width of the second portions 22b is set smaller than the Y directional width of the first portions 22a and the X directional width of the gate electrodes 17. The X directional width of the second portions 22b is set to, for example, about 1 μm.

The first and second portions 22a and 22b may be formed of the same material or different materials. Each second portion 22b in the present modification is, for example, a tungsten layer. Each first portion 22a in the present modification is, for example, a tungsten layer, a polysilicon layer, or a stack layer including both of these layers.

According to the present modification, since the gate interconnect 22 includes not only the first portions 22a but also the second portions 22b, it is possible to reduce the resistance of the gate interconnect 22 even further and to realize increase in speed of the power transistor and uniform operation at on-state of the power transistor.

Figure 12A:
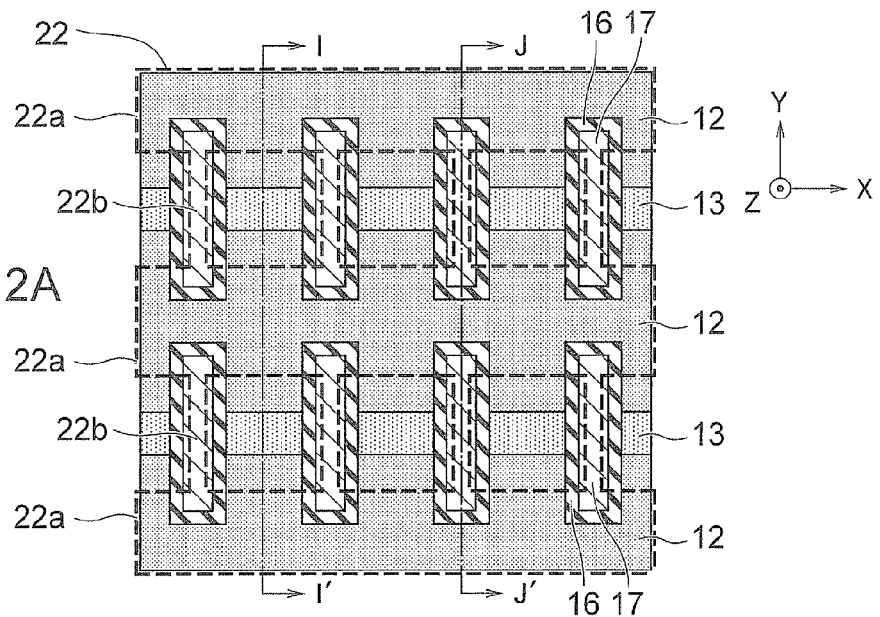
FIGS. 12A to 12C are a plan view and sectional views showing a structure of a semiconductor device of a modification of the second embodiment.
Figure 12B:
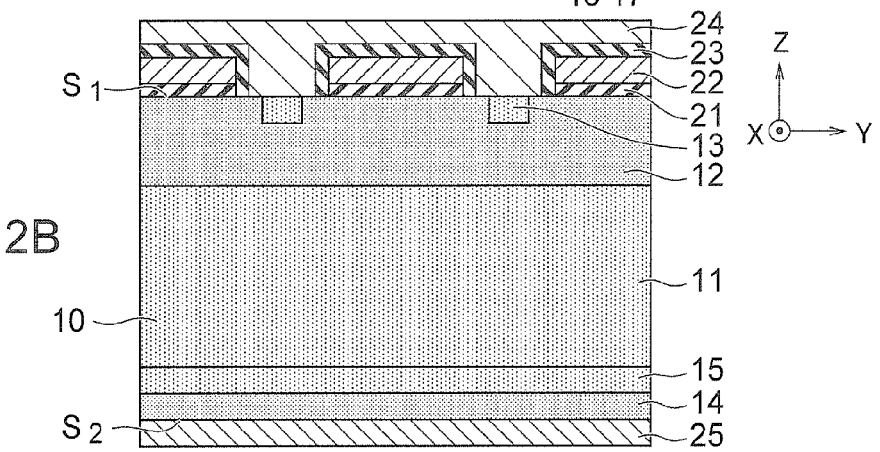
Figure 12C:
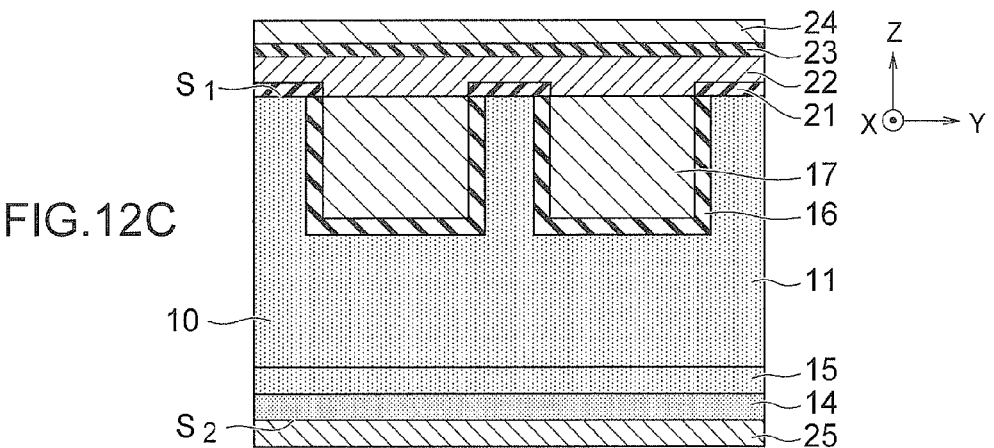

FIGS. 12A to 12C are a plan view and sectional views showing a structure of a semiconductor device of a modification of the second embodiment.

The semiconductor device in FIGS. 12A to 12C includes a gate interconnect 22 similar to the gate interconnect 22 in the semiconductor device in FIGS. 11A to 11C. Consequently, according to the present modification, since the gate interconnect 22 includes not only the first portions 22a but also the second portions 22b, it is possible to reduce the resistance of the gate interconnect 22 even further and to realize increase in speed of the power transistor and uniform operation at on-state of the power transistor. As illustrated in FIGS. 12A to 12C, the second portions 22b in the present modification are disposed on all the gate electrodes 17.

The respective gate interconnects 22 illustrated in FIGS. 11A to 12C are applicable to the embodiments other than the first and second embodiments.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate having first and second main surfaces;
   control electrodes disposed in trenches on the first main surface of the semiconductor substrate via insulators, and extending in a first direction parallel to the first main surface; and control interconnects disposed on the first main surface of the semiconductor substrate so as to be electrically connected to the control electrodes, and extending in a second direction perpendicular to the first direction, the semiconductor substrate comprising:

a first semiconductor layer of a first conductivity type disposed in the semiconductor substrate;

one or more second semiconductor layers of a second conductivity type disposed on a surface of the first semiconductor layer on a first main surface side so as to be sandwiched between the control electrodes;

one or more third semiconductor layers of the first conductivity type disposed on surfaces of the second semiconductor layers on the first main surface side so as to be sandwiched between the control electrodes, and extending in the second direction; and a fourth semiconductor layer of the second conductivity type disposed on the second main surface of the semiconductor substrate.

2. The device of claim 1, wherein a width of the control interconnects in the first direction is 50 μm or less.

3. The device of claim 1, wherein the control electrodes are disposed on straight lines parallel to the first direction, and two or more control electrodes separated from each other are disposed on each of the straight lines.

4. The device of claim 3, wherein the control interconnects are disposed to be sandwiched between the control electrodes adjacent to each other in the first direction.

5. The device of claim 4, wherein each control interconnect is electrically connected to control electrodes which sandwich the control interconnect.

6. The device of claim 1, wherein the second semiconductor layers are disposed on straight lines parallel to the first direction, and two or more second semiconductor layers separated from each other are disposed on each of the straight lines.

7. The device of claim 6, wherein the control interconnects are disposed to be sandwiched between the second semiconductor layers adjacent to each other in the first direction.

8. The device of claim 7, wherein a portion of each control interconnect is disposed on second semiconductor layers which sandwich the control interconnect, via an insulator.

9. The device of claim 1, wherein the control interconnects are continuously disposed on the surface of the first semiconductor layer and the surfaces of the second semiconductor layers via insulators, and function as control electrodes of transistors.

10. The device of claim 1, wherein the semiconductor substrate further comprises one or more fifth semiconductor layers of the second conductivity type disposed in the second semiconductor layers between bottom surfaces of the second semiconductor layers and bottom surfaces of the third semiconductor layers.

11. The device of claim 10, wherein a concentration of impurities of the second conductivity type in the fifth semiconductor layers is higher than a concentration of impurities of the second conductivity type in the second semiconductor layers.

12. The device of claim 1, wherein a vertical length of the second semiconductor layers is smaller than a vertical length of the trenches for the control electrodes.

13. The device of claim 1, wherein the semiconductor substrate further comprises one or more sixth semiconductor layers of the first conductivity type disposed between the first semiconductor layer and the second semiconductor layers so as to contact bottom surfaces of the second semiconductor layers or to contact the bottom surfaces and side surfaces of the second semiconductor layers.

14. The device of claim 13, wherein a concentration of impurities of the first conductivity type in the sixth semiconductor layers is higher than a concentration of impurities of the first conductivity type in the first semiconductor layer.

15. The device of claim 13, wherein a sum of vertical lengths of the second and sixth semiconductor layers is smaller than a vertical length of the trenches for the control electrodes.

16. The device of claim 1, further comprises main electrodes disposed in trenches placed between the control electrodes via insulators and extending in the first direction.

17. The device of claim 16, wherein the control electrodes and the main electrodes are alternately disposed on the first main surface of the semiconductor substrate.

18. The device of claim 16, wherein the control interconnects are electrically connected to the control electrodes and electrically insulated from the main electrodes.

19. A semiconductor device comprising:

a semiconductor substrate having first and second main surfaces;

control electrodes disposed in trenches on the first main surface of the semiconductor substrate via insulators, and extending in a first direction parallel to the first main surface; and a control interconnect disposed on the first main surface of the semiconductor substrate so as to be electrically connected to the control electrodes, the control interconnect including first portions extending in a second direction perpendicular to the first direction and second portions extending in the first direction and connecting the first portions, the semiconductor substrate comprising:

a first semiconductor layer of a first conductivity type disposed in the semiconductor substrate;

one or more second semiconductor layers of a second conductivity type disposed on a surface of the first semiconductor layer on a first main surface side so as to be sandwiched between the control electrodes;

one or more third semiconductor layers of the first conductivity type disposed on surfaces of the second semiconductor layers on the first main surface side so as to be sandwiched between the control electrodes, and extending in the second direction; and a fourth semiconductor layer of the second conductivity type disposed on the second main surface of the semiconductor substrate.

20. The device of claim 19, wherein the second portions are disposed on the control electrodes.

* * * * *